United States Patent
Dylewicz et al.

(10) Patent No.: US 10,483,010 B2
(45) Date of Patent: Nov. 19, 2019

(54) REDUCTION OF SURFACE AND EMBEDDED SUBSTRATE CHARGE BY CONTROLLED EXPOSURE TO VACUUM ULTRAVIOLET (VUV) LIGHT IN LOW-OXYGEN ENVIRONMENT

(71) Applicant: Lam Research AG, Villach (AT)

(72) Inventors: Rafal Dylewicz, Villach (AT); Reinhold Schwarzenbacher, Reisseck (AT); Xia Man, Singapore (SG); Kenichi Sano, Sunnyvale, CA (US); David Lou, Villach (AT); Milan Pliska, Villach (AT)

(73) Assignee: LAM RESEARCH AG, Villach (AT)

( * ) Notice: Subject to any disclaimer, the term of this patent is extended or adjusted under 35 U.S.C. 154(b) by 171 days.

(21) Appl. No.: 15/258,397

(22) Filed: Sep. 7, 2016

(65) Prior Publication Data

US 2018/0068754 A1  Mar. 8, 2018

(51) Int. Cl.
*G21K 1/14* (2006.01)
*H01L 21/67* (2006.01)
*H01L 21/02* (2006.01)

(52) U.S. Cl.
CPC .......... *G21K 1/14* (2013.01); *H01L 21/67051* (2013.01); *H01L 21/67115* (2013.01); *H01L 21/02348* (2013.01)

(58) Field of Classification Search
None
See application file for complete search history.

(56) References Cited

U.S. PATENT DOCUMENTS

| | | |
|---|---|---|
| 4,041,313 A | 8/1977 | Potter et al. |
| 4,903,717 A | 2/1990 | Sumnitsch |
| 5,513,668 A | 5/1996 | Sumnitsch |
| 6,440,756 B2 | 8/2002 | Shohet et al. |
| 7,755,764 B2 | 7/2010 | Kwak et al. |
| 7,892,445 B1 * | 2/2011 | Wei .................. H01L 21/67069 216/58 |
| 8,833,380 B2 | 9/2014 | Obweger et al. |
| 9,190,310 B2 | 11/2015 | Brugger et al. |
| 2001/0041375 A1 * | 11/2001 | Shohet .............. H01J 37/32339 438/4 |
| 2002/0149774 A1 * | 10/2002 | McAninch ............. G01N 21/15 356/445 |

(Continued)

FOREIGN PATENT DOCUMENTS

JP    2014083470 A  *  5/2014

OTHER PUBLICATIONS

"Ionization Technology That Works in a Vacuum—VUV Ionizer"; Technical Information; Hamamatsu Photonics K.K., TLSZ9001E02; Nov. 2014.

*Primary Examiner* — James Choi (57) ABSTRACT

A system for reducing surface and embedded charge in a substrate includes a substrate support configured to support a substrate. A vacuum ultraviolet (VUV) assembly is arranged adjacent to the substrate and includes a housing and a VUV lamp that is connected to the housing and that generates and directs ultraviolet (UV) light at the substrate. A movement device is configured to move at least one of the VUV assembly and the substrate support during exposure of the substrate to the UV light to reduce surface and embedded charge in the substrate.

19 Claims, 8 Drawing Sheets

(56) References Cited

U.S. PATENT DOCUMENTS

| | | | |
|---|---|---|---|
| 2004/0011464 A1* | 1/2004 | Shan | H01J 37/321 |
| | | | 156/345.38 |
| 2006/0201623 A1* | 9/2006 | Yoo | C23C 16/0236 |
| | | | 156/345.3 |
| 2007/0017554 A1* | 1/2007 | Okano | B24B 37/345 |
| | | | 134/26 |
| 2007/0228289 A1* | 10/2007 | Kaszuba | B05D 3/067 |
| | | | 250/492.1 |
| 2007/0298167 A1 | 12/2007 | Ho et al. | |
| 2010/0285240 A1* | 11/2010 | Rocha-Alvarez | B05D 3/0209 |
| | | | 427/595 |
| 2013/0302996 A1* | 11/2013 | Reilly | C23C 16/26 |
| | | | 438/758 |
| 2014/0283935 A1 | 9/2014 | Schwarzenbacher et al. | |

* cited by examiner

REDUCTION OF SURFACE AND EMBEDDED SUBSTRATE CHARGE BY CONTROLLED EXPOSURE TO VACUUM ULTRAVIOLET (VUV) LIGHT IN LOW-OXYGEN ENVIRONMENT

FIELD

The present disclosure relates to substrate processing systems, and more particularly to systems and methods for reducing surface and embedded substrate charge.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Residual surface and embedded charge may be created on a substrate such as a semiconductor wafer during processing. For example, residual surface and embedded charge may be created during dry etching. Substrate processing systems for performing dry etching typically include a processing chamber, a gas distribution device such as a showerhead and a substrate support. A substrate such as a semiconductor wafer may be arranged on the substrate support. In some examples, the substrate support includes an electrostatic chuck (ESC). During processing, different gas mixtures may be introduced into the processing chamber. During the process, the substrate support may be biased by DC or radio frequency (RF) power.

During processing, substrates are often subjected to wet spin-clean processes to remove chemicals and/or particles either before or after a process. During wet cleaning, the substrates may be subjected to a liquid such as a rinsing liquid that is dispensed onto the substrate as it is rotated. Loss of yield can be directly linked with wet-clean processes that are conducted on substrates having residual surface and embedded charge. Arcing-related defects (or volcano defects) are the most likely mechanism behind the yield decrease.

To prevent damage to the substrate and/or defects during subsequent processing, efforts have been made to reduce or eliminate the residual surface and embedded charge. Techniques for reducing residual surface charge include corona discharge, soft X-ray photo-ionization, and alpha particle-ionization. For example, ion-assisted wafer discharge generates positively-charged and negatively-charged ions close to a surface of the substrate. Free charge carriers (ions) are attracted to a surface of the substrate due to the presence of a charge on the substrate. The free charge carriers counteract charge at the surface of the substrate. However, the ions cannot penetrate into the substrate to reduce the embedded charge.

SUMMARY

A system for reducing surface and embedded charge in a substrate includes a substrate support configured to support a substrate. A vacuum ultraviolet (VUV) assembly is arranged adjacent to the substrate support and includes a housing and a VUV lamp that is connected to the housing and that generates and directs ultraviolet (UV) light at the substrate. A movement device is configured to move at least one of the VUV assembly and the substrate support during exposure of the substrate to the UV light to reduce surface and embedded charge in the substrate.

In other features, the housing is configured to direct an oxygen-reducing purge gas into a gap between the VUV lamp and the substrate. A gas delivery system supplies the oxygen-reducing purge gas. The oxygen-reducing purge gas has an oxygen content that is less than 5% by mass.

In other features, the housing includes a first inlet to receive purge gas; a first fluid channel in fluid communication with the first inlet; and a first outlet in fluid communication with the first fluid channel. The first outlet directs the oxygen-reducing purge gas into the gap between the VUV lamp and the substrate.

In other features, the housing includes a second inlet to receive ambient gas; a second fluid channel in fluid communication with the second inlet; and a second outlet in fluid communication with the second fluid channel and a vacuum source.

In other features, the housing is configured to draw ambient gas through the housing under vacuum supplied by a vacuum source remote from the VUV assembly to cool the VUV assembly.

In other features, the movement device includes a rotating device configured to rotate the substrate support relative to the VUV assembly during exposure of the substrate to the UV light generated by the VUV lamp. The movement device is configured to move the VUV assembly relative to the substrate support while the UV light is generated by the VUV lamp.

In other features, the movement device includes a substrate rotating device configured to rotate the substrate support during exposure of the substrate to the UV light generated by the VUV lamp; and a radial movement device configured to move the VUV assembly in a radial direction relative to the substrate support while the substrate support is rotating and while the UV light is generated by the VUV lamp.

In other features, the VUV lamp has an exposure period that is between 5 seconds and 15 seconds.

In other features, the first fluid channel has an annular shape. The first outlet comprises a plurality of spaced nozzles passing from the first fluid channel through a substrate-facing surface of the housing.

In other features, the first fluid channel has an annular shape that circumscribes the VUV lamp. The first outlet comprises an annular slot passing from the first fluid channel through a substrate-facing surface of the housing.

In other features, a VUV array includes a plurality of the VUV assembly. The movement device includes a scanning device configured to scan the VUV array across a surface of the substrate.

A treatment system for exposing a substrate to liquid includes the system for reducing surface and embedded charge. At least one liquid dispenser dispenses liquid on the substrate.

In other features, one of a pin chuck and a spin chuck includes the substrate support and the movement device.

In other features, the VUV lamp and the substrate support are located in a processing chamber. The processing chamber is one of a closed processing chamber and an open processing chamber that is open to a clean room environment. Ambient gas in the processing chamber has a pressure greater than or equal to 800 hPa.

A method for reducing surface and embedded charge in a substrate includes arranging a substrate on a substrate support; arranging a vacuum ultraviolet (VUV) assembly including a housing and a VUV lamp adjacent to the substrate support; and directing ultraviolet (UV) light at the substrate while moving at least one of the VUV assembly and the substrate support during exposure of the substrate to the UV light to reduce surface and embedded charge in the substrate.

In other features, the method includes directing an oxygen-reducing purge gas into a gap between the VUV lamp and the substrate.

In other features, the method includes discharging the VUV lamp during an exposure period that is between 5 seconds and 15 seconds.

In other features, the method includes arranging the substrate support and the VUV assembly in a processing chamber. The processing chamber is one of a closed processing chamber and an open processing chamber that is open to a clean room environment. The method includes supplying gas having an oxygen content that is less than 5 mass-% to the processing chamber.

In other features, the method includes drawing ambient gas through the housing under vacuum supplied by a vacuum source that is remote from the VUV assembly to cool the VUV assembly.

In other features, the moving includes rotating the substrate support during exposure of the substrate to the UV light generated by the VUV lamp while moving the VUV assembly in a radial direction relative to the substrate support.

In other features, the method includes arranging the VUV assembly in a VUV array including a plurality of the VUV assembly; and scanning the VUV array across a surface of the substrate arranged on the substrate support.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure neutralize surface charge on a substrate and embedded charge inside of the substrate. The systems and methods described herein use a VUV assembly including a VUV lamp as an ionizer to reduce residual surface and embedded charge.

Embedded charge reduction is based on absorption of photons generated by the VUV lamp. The photons that are absorbed generate free charge carriers inside of the substrate near existing embedded electric fields. The free-charge carriers include electron-hole pairs that have negative and positive charge. Photon energy is transferred to atoms of the substrate materials. The photons excite electrons from a valence band to a conduction band. Thus, photon-induced charge carriers (electron and holes) become available in the substrate and migrate to the embedded electric fields in the substrate.

Figure 1:
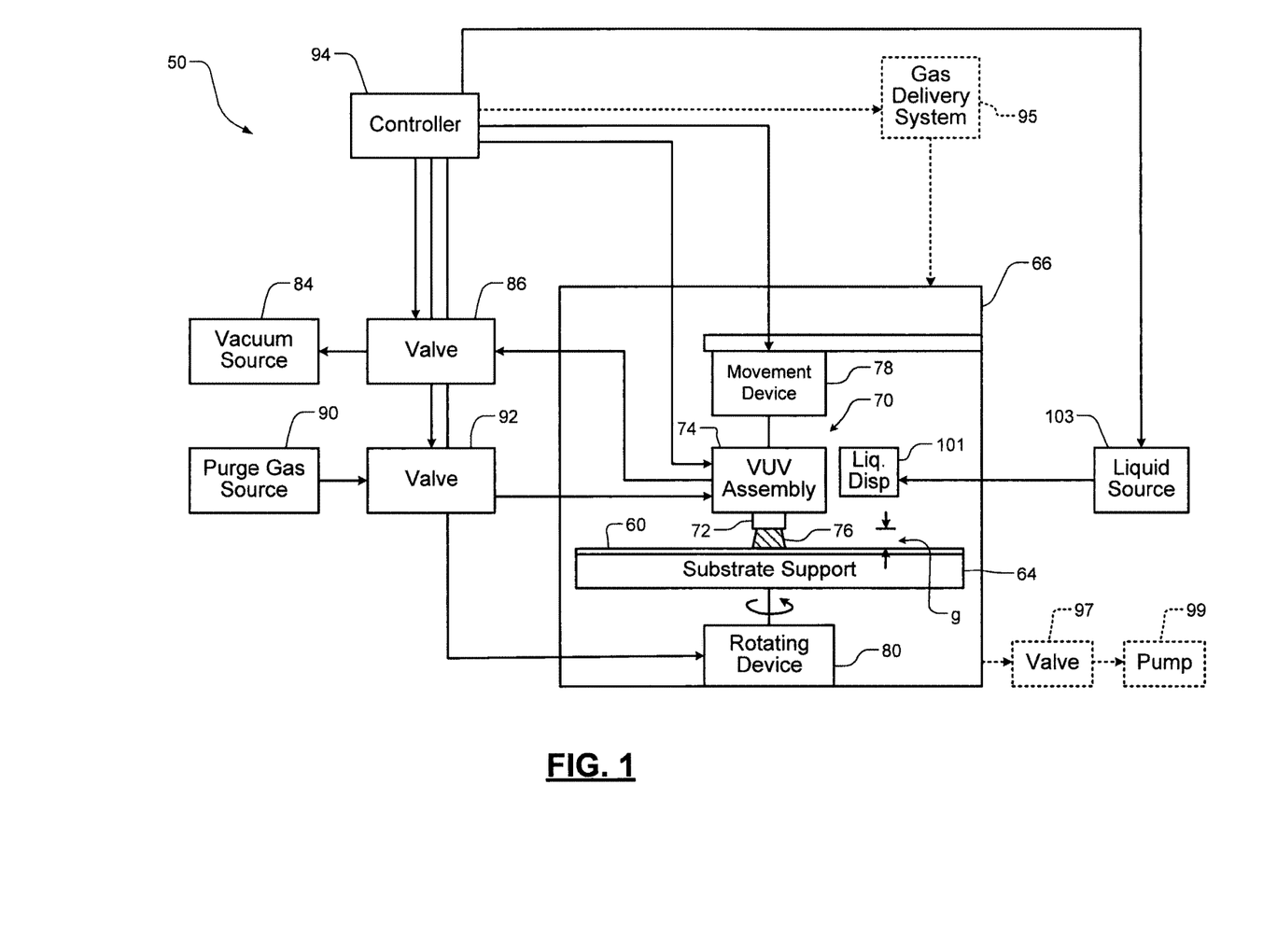
FIG. 1 is a functional block diagram of a substrate charge reducing system according to the present disclosure.

Referring now to FIG. 1, a substrate charge reducing system 50 is shown. A substrate 60 is arranged on a substrate support 64. In some examples, the substrate support 64 may be arranged in a substrate processing chamber 66 like a single wafer wet treatment device. A vacuum ultraviolet (VUV) assembly 70 includes a VUV lamp 72 and a VUV housing 74. The VUV lamp 72 is arranged within a predetermined distance (identified by "g") of an upper surface of the substrate 60. The VUV lamp 72 generates a UV light beam 76 that impinges upon the substrate 60.

A movement device 78 is configured to provide relative movement between the VUV assembly 70 and the substrate support 64 during charge reduction. In some examples, the movement device 78 moves the VUV assembly 70 relative to the substrate support 64. In some examples, the movement device 78 moves the VUV assembly 70 in a direction from center to edge, edge to center, edge to edge or another pattern. In some examples, the movement device 78 is an arm rotated so that the VUV assembly performs a movement along an arc of a circle from center to edge. A rotating device 80 is configured to rotate the substrate support 64 and the substrate 60 during charge reduction.

In some examples, the substrate support 64 and the rotating device 80 can include a spin chuck as shown and described in commonly-assigned U.S. Pat. No. 9,190,310, issued on Nov. 17, 2015, which is incorporated herein by reference in its entirety. In some examples, the substrate support 64 and the rotating device 80 can include a pin chuck, which touches an edge of the substrate with gripping pins. Examples of pin chucks include Bernoulli-chucks (as described in U.S. Pat. Nos. 4,903,717 and 5,513,668) or ring-chucks (e.g. as described in commonly-assigned U.S. Pat. No. 8,833,380), which are incorporated herein by reference in their entirety.

A remote vacuum source 84 is selectively connected to the VUV assembly 70 using a valve 86 or other suitable flow control device. The remote vacuum source 84 is selectively used to draw ambient gas through the VUV housing 74 to cool the VUV assembly 70 during operation of the VUV lamp 72. Use of the remote vacuum source 84 instead of a local fan reduces generation and recirculation of particles that may cause defects.

A purge gas source 90 selectively supplies purge gas to the VUV assembly 70 using a valve 92 or other suitable flow control device. In some examples, the purge gas includes molecular nitrogen ($N_2$). In some examples the oxygen content is below 5% by mass. The VUV assembly 70 directs the purge gas between the VUV assembly 70 and the substrate 60 during charge reduction.

A controller 94 communicates with and coordinates operation of the VUV lamp 72, rotation of the rotating device 80, movement of the movement device 78, and states of the valves 86 and 92.

As an alternative to purging the gap between the VUV lamp 72 and the substrate, the substrate charge removal system can be performed in a low oxygen environment. For example, the substrate charge removal system can use an inert gas or other low oxygen process gas in the substrate processing chamber rather than ambient oxygen gas. A gas delivery system 95, a valve 97 and a pump 99 may be used to evacuate the substrate processing chamber and to supply a gas having less than or equal to 5% by mass oxygen gas. For example, the process gas may include an inert gas.

In use, the substrate 60 is arranged on the substrate support 64. The controller 94 supplies purge gas between the VUV assembly 70 and the substrate 60. The controller 94 cools the VUV assembly 70 by connecting the remote vacuum source 84 to the VUV housing 74. The controller 94 rotates the substrate support 64 using the rotating device 80. The controller 94 turns on the VUV lamp 72 and moves the VUV assembly 70 relative to the substrate support 64 using the movement device 78 to scan the UV light beam 76 across a surface of the substrate 60.

One or more liquid dispensers 101 may be arranged above the substrate support 64 to dispense liquid from a liquid source 103 onto the substrate 60 as the substrate is rotated by the rotating device 80. In some examples, at least one of the liquid dispensers 101 is located above a center of the substrate 60 when the liquid is dispensed. In some examples, the liquid includes a cleaning fluid, a rinsing fluid, a spin-on liquid such as spin-on film, etc. In some examples, the substrate support 64 and the rotating device 80 comprise a pin chuck or a spin chuck. The controller 94 may also control liquid that is dispensed from the liquid dispenser 101.

Figure 2:
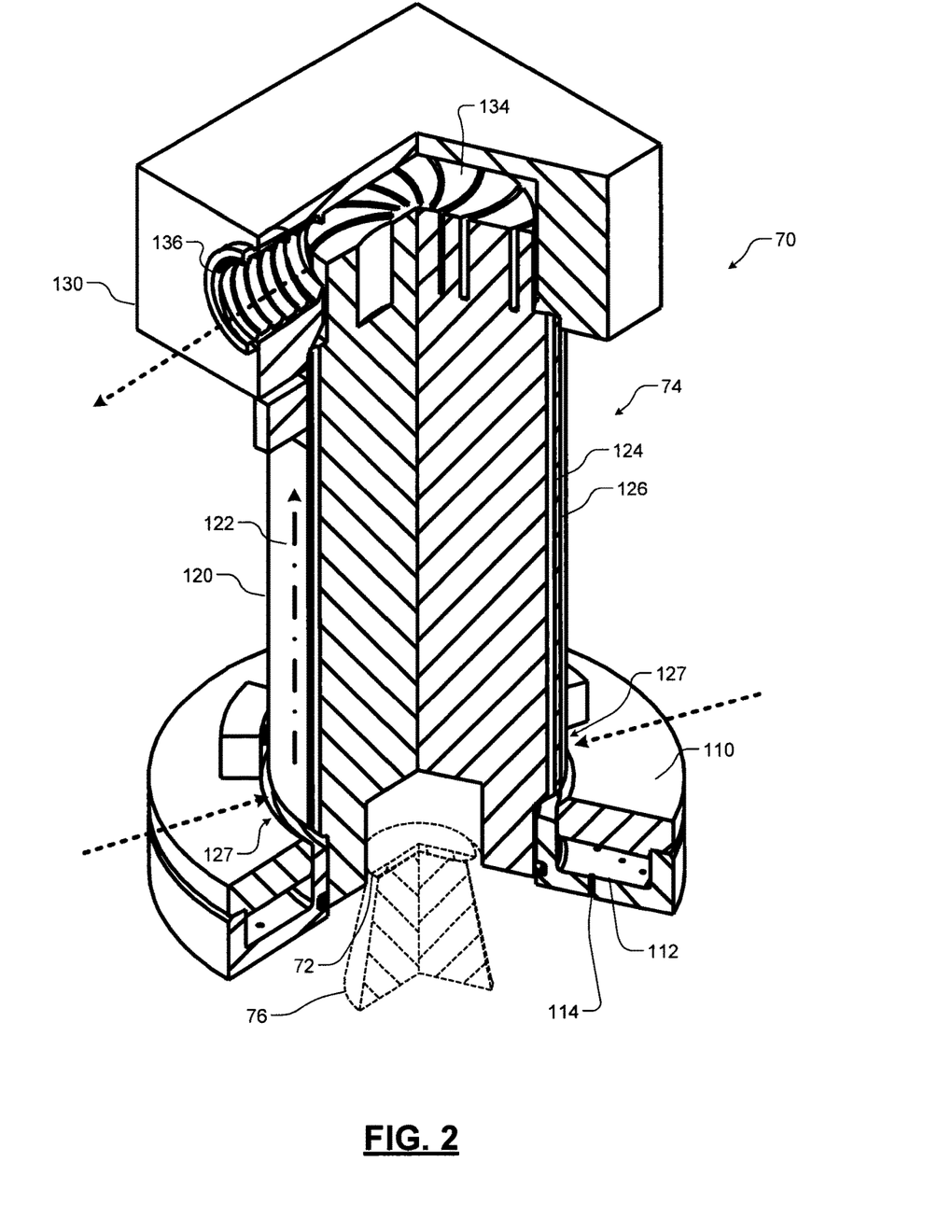
FIG. 2 is a partial perspective view of an example of a vacuum ultraviolet (VUV) assembly according to the present disclosure.
Figure 3:
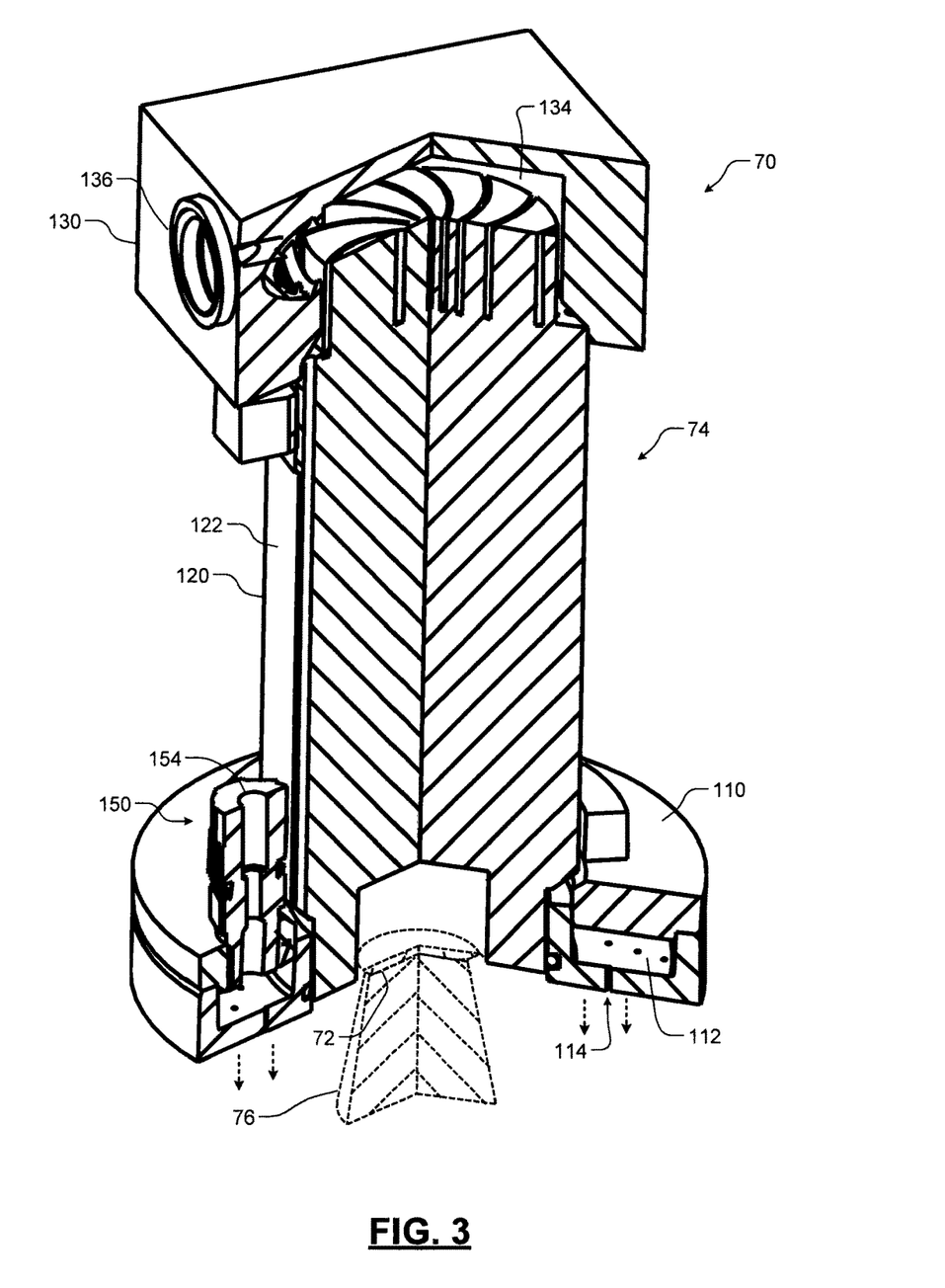
FIG. 3 is a rotated, partial perspective view of the VUV assembly of FIG. 2.
Figure 4:
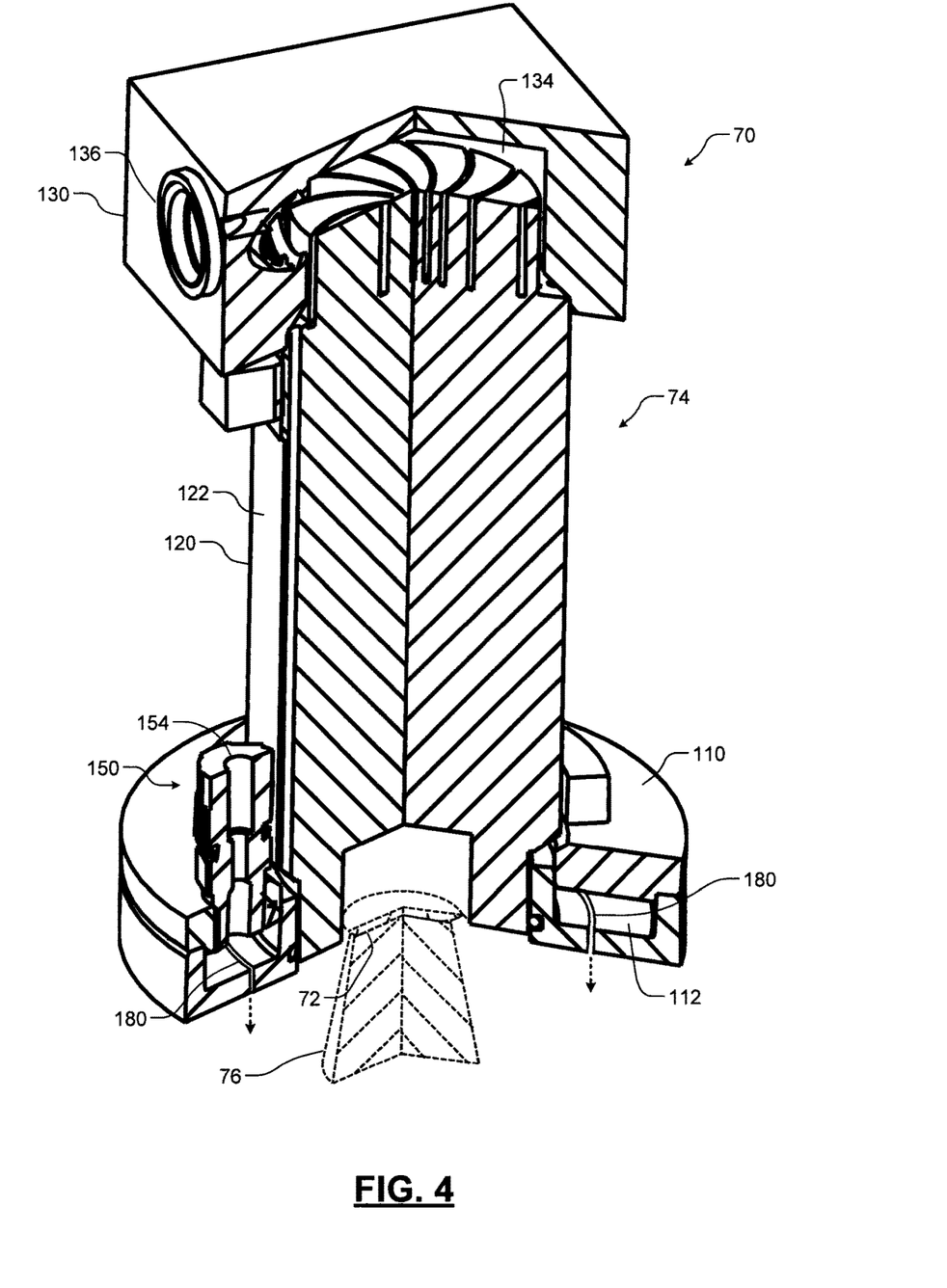
FIG. 4 is a partial perspective view of another VUV assembly according to the present disclosure.

Referring now to FIGS. 2-4, the VUV housing 74 of the VUV assembly 70 is shown in further detail. In FIG. 2, the VUV housing 74 includes a lower housing portion 110, a middle housing portion 120 and an upper housing portion 130. In some examples, the lower housing portion 110 has an annular shape. The lower housing portion 110 defines an annular cavity 112 and a plurality of spaced holes 114 passing through a substrate-facing surface of the annular cavity 112. In some examples, the middle housing portion 120 has a cylindrical shape. The middle housing portion 120 includes an outer wall 122, an inner wall 124 and a fluid passage 126 defined therebetween. Fluid inlets 127 are defined at a junction between the middle housing portion 120 and the lower housing portion 110. The fluid inlets 127 may include an annular opening, a plurality of holes, etc. or other type of fluid inlet. The fluid inlet 127 is in fluid communication with the fluid passage 126 in the middle housing portion 120. The upper housing portion 130 of the VUV housing 74 defines a cavity 134 in fluid communication with the fluid passage 126. An outlet 136 of the upper housing portion 130 is in fluid communication with the cavity 134. The outlet 136 is connected to the valve 86 and the remote vacuum source 84 in FIG. 1.

During operation, the valve 86 is opened and the remote vacuum source 84 draws ambient gas through the fluid inlet 127, the fluid passage 126 of the middle housing portion 120, the cavity 134 of the upper housing portion 130 and the outlet 136. The ambient gas cools the VUV assembly 70 by exchanging heat with the VUV assembly 70. Using the remote vacuum source 84 reduces particle generation and/or spreading of particles that may cause defects.

In FIG. 3, the lower housing portion 110 of the VUV housing 74 further includes an inlet 150 defining a fluid passage 154 to the annular cavity 112. The inlet 150 is selectively connected by the valve 92 to the purge gas source 90. During operation, the valve 92 is opened and purge gas from the purge gas source 90 is directed through the fluid passage 154 of the inlet 150 into the annular cavity 112. The purge gas flows through the plurality of spaced holes 114 in a downward direction towards the substrate 60. In FIG. 4, the plurality of spaced holes 114 can be replaced by or supplemented by an annular slit 180.

Figure 5:
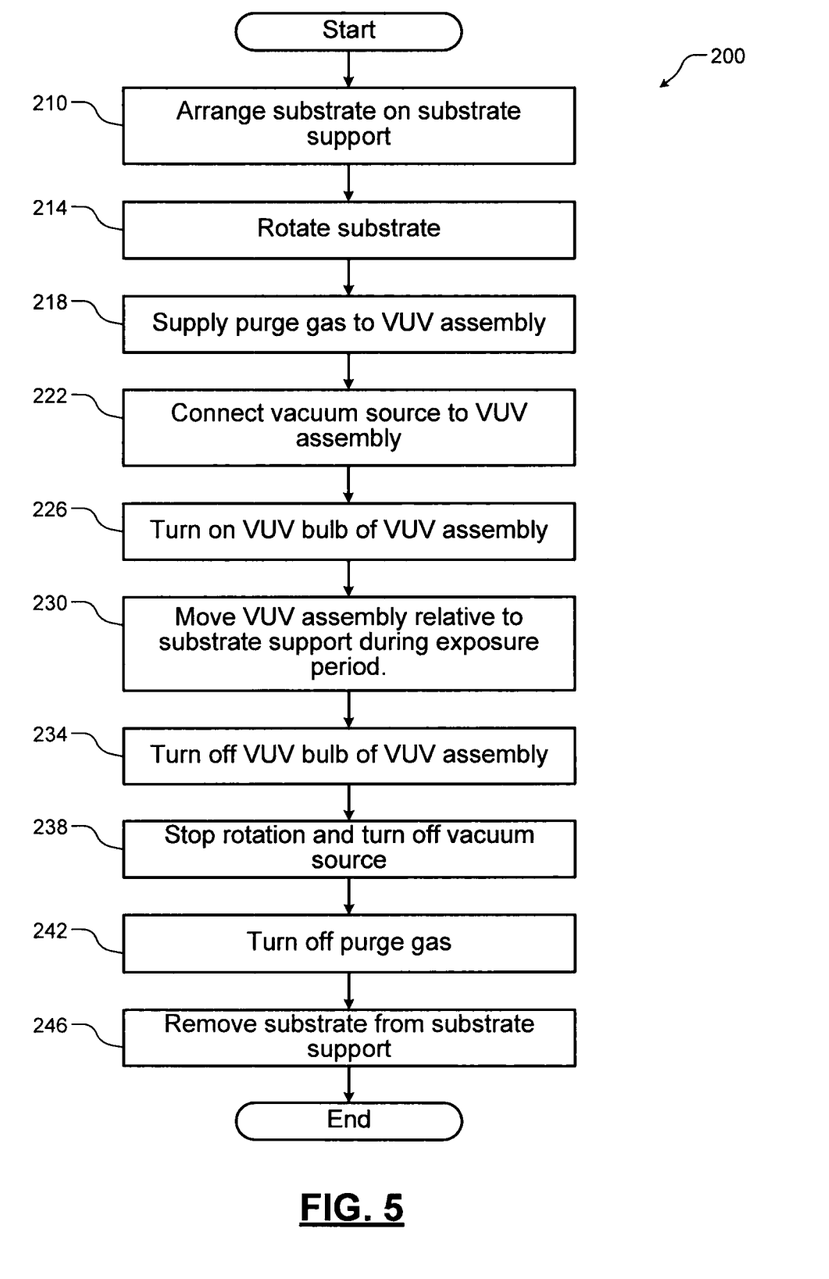
FIG. 5 is a flowchart illustrating an example of a method for reducing surface and embedded charge on a substrate according to the present disclosure.

Referring now to FIG. 5, a method 200 for reducing surface and embedded substrate charge is shown. At 210, a substrate is arranged on a substrate support. At 214, the substrate is rotated. At 218, purge gas is supplied to the VUV assembly and is directed between the VUV assembly and the substrate. At 222, a vacuum source is connected to the VUV assembly to draw ambient gas there through to cool the VUV assembly. At 226, the VUV lamp of the VUV assembly is turned on. At 230, the VUV assembly is moved relative to the substrate support during an exposure period. In some examples, the VUV lamp is linearly scanned across the substrate from center to edge as the substrate is rotated. When exposure is complete, the VUV lamp of the VUV assembly is turned off at 234. At 238, the vacuum source is turned off. At 242, the purge gas is turned off. At 246, the substrate is removed from the substrate support.

Figure 6:
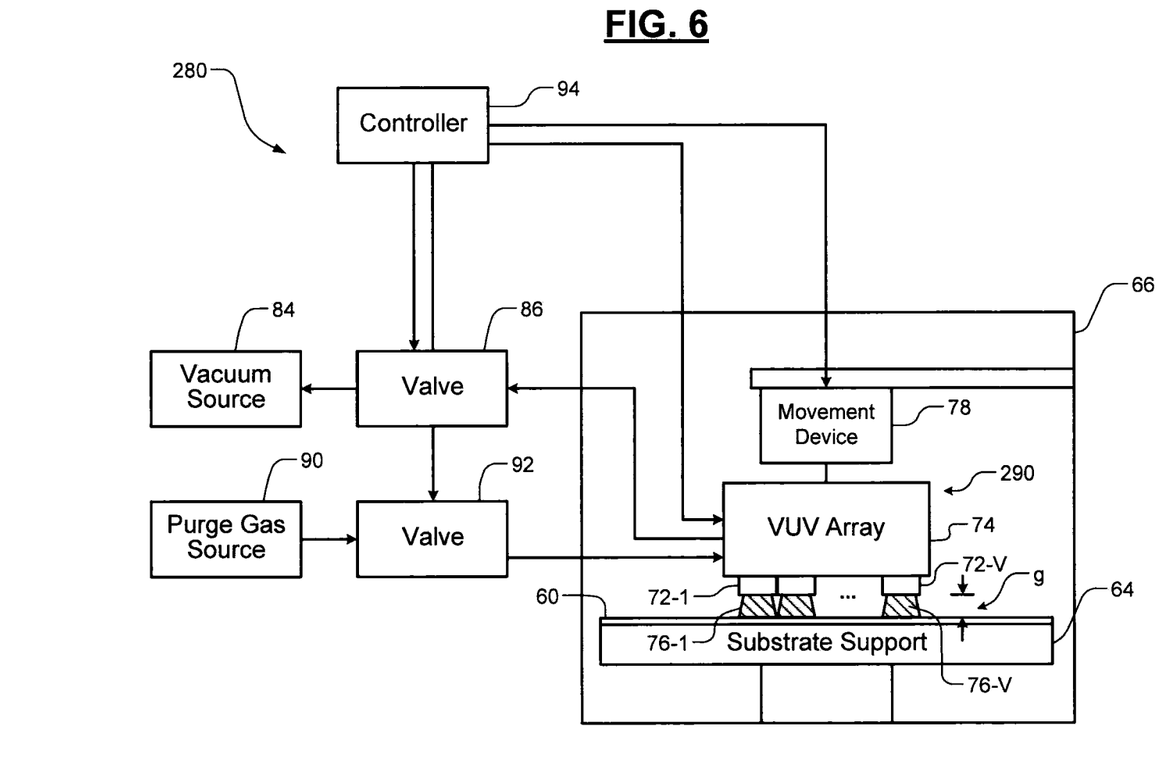
FIG. 6 is a functional block diagram of an example of a VUV array including multiple VUV lamps according to the present disclosure.

Referring now to FIG. 6, another charge reducing system 280 is shown to include a VUV array 290 including a plurality of VUV lamps 72-1, 72-2, . . . , and 72-V (collectively VUV lamps 72), where V is an integer greater than one. In some examples, V is equal to 3, 4, 5 or 6. In some examples, the substrate support is not rotated. The VUV lamps 72 of the VUV array 290 are scanned across the substrate 60 while the substrate remains stationary.

Figure 7A:
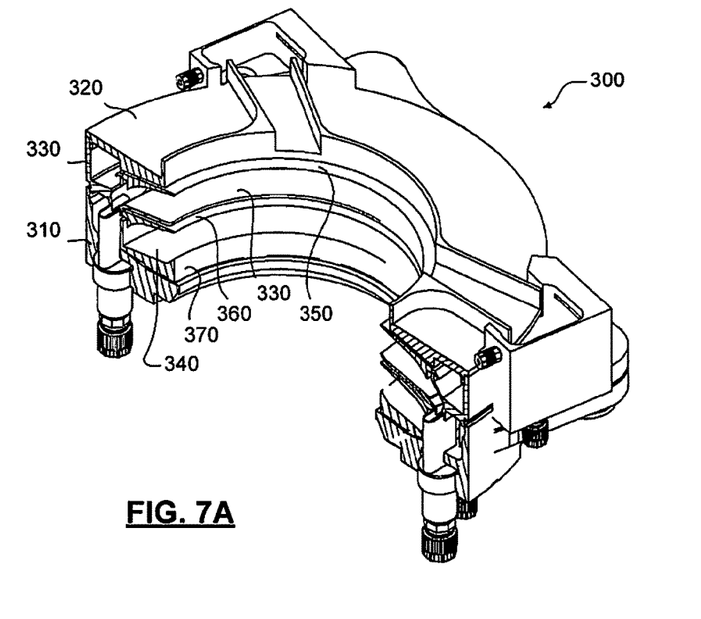
FIGS. 7A-7C illustrates an example of a collector assembly, a pin chuck and a VUV assembly.
Figure 7B:
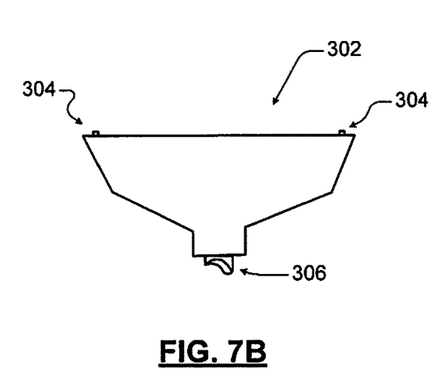
Figure 7C:
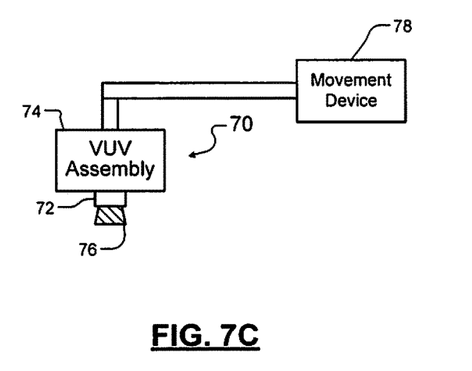

Referring now to FIGS. 7A-7C, an example of processing chamber that is open to a clean room environment is shown. A collector assembly 300 that is shown in FIG. 7A is arranged around a pin chuck 302 that is shown in FIG. 7B. The pin chuck 302 includes a plurality of pins 304 that selectively engage a radially outer edge of the substrate. Gas nozzles (not shown) that are located at a center of an upper surface of the pin chuck 302 direct gas in an upward direction. Gas nozzles (not shown) that are located at radially outer portions of the upper surface of the pin chuck 302 direct gas upwardly and radially outwardly. As a result, the substrate rests on a gas cushion during treatment and does not come into contact with the upper surface of the pin chuck 302 (other than through contact with the pins 304). In some examples, the pin chuck 302 is selectively rotated by a hollow shaft 306 that is connected to a drive motor (not shown). Gas supplied to the nozzles may be supplied through the hollow shaft 306.

In some examples, the collector assembly 300 includes a base component 310, a top component 320, a first intermediate component 330 and a second intermediate component 340, although additional or fewer components can be used. In some examples, different levels that are defined by the components 320, 330 and 340 are used for processing the substrate using different types of liquids. The other half of the collector assembly 300 that is not visible in FIG. 7A is generally a mirror image. The collector assembly 300 also optionally includes an upper deflector 350, a middle deflector 360 and a lower deflector 370.

In some examples, a funnel (not shown) may be arranged above the top component 320 to direct ambient gas (such as air) from the clean room environment into the collector assembly 300. In some examples, the funnel may include one or more vertical slots (not shown) to enable insertion of arms for substrate placement and/or movement of the VUV assembly 70.

The pin chuck 302 is movable relative to the collector assembly 300 between an upper loading and unloading position and the different levels corresponding to the top component 320, the first intermediate component 330 and the second intermediate component 340. Relative movement between the collector assembly 300 and the pin chuck 302 may be achieved either by raising and lowering the pin chuck 302 relative to the collector assembly 300, by raising and lowering the collector assembly 300 relative to the pin chuck 302, or by simultaneously raising or lowering both the pin chuck 302 and the collector assembly 300 in opposite directions or at differing speeds in the same direction. Additional details relating to the collector assembly 300 are shown in commonly assigned U.S. Patent Publication No. US 2014/0283935, published on Sep. 24, 2016, which is hereby incorporated by reference in its entirety.

In FIG. 7C, the movement device 78 moves the VUV assembly 70 from a non-operating position to an operating position located above the substrate for reducing surface and embedded charge as described herein. In some examples, the pin chuck 302 is moved to the upper loading and unloading position during surface and embedded charge reduction. In other examples, the pin chuck 302 can be located at one of the levels during surface and embedded charge reduction. In some examples, the movement device 78 moves up and down and/or swivels laterally to allow the VUV assembly 70 to be positioned in the operating position above the pin chuck 302. After reducing surface and embedded charge, the VUV assembly 70 may be moved to the non-operating position (that does not obstruct operation or loading and/or unloading of the substrates). While a single movement device 78 is shown, two or more movement devices may be used to move the VUV assembly 70. For example, movement between the operating and non-operating positions may be performed by one or more movement devices and scanning movement during surface and embedded charge reduction may be performed by one or more movement devices.

Figure 8:
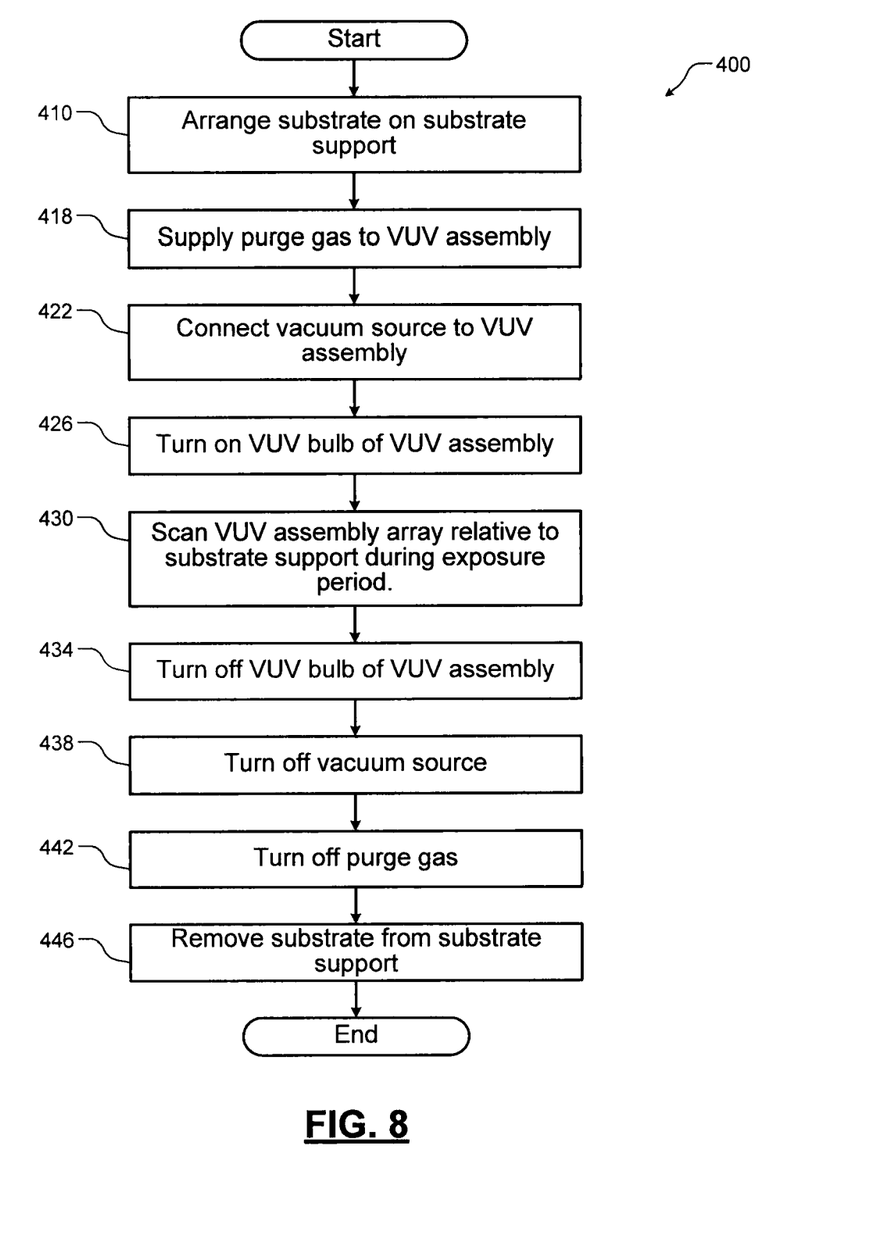
FIG. 8 is a flowchart illustrating a method for reducing surface and embedded charge using the system in FIG. 6.

Referring now to FIG. 8, a method 400 for reducing surface and embedded substrate charge is shown. At 410, a substrate is arranged on a substrate support. At 418, purge gas is supplied to the VUV array and is directed between the VUV array and the substrate. At 422, a vacuum source is connected to the VUV assembly to draw ambient gas to cool the VUV array. At 426, the VUV lamps of the VUV array are turned on. At 430, the VUV array is scanned across to the substrate support during an exposure period. In some examples, the light from the VUV lamp is scanned across the substrate from edge to edge. When the exposure is complete, the VUV lamp of the VUV assembly is turned off at 434. At 438, the vacuum source is turned off. At 442, the purge gas is turned off. At 446, the substrate is removed from the substrate support.

In some examples, the substrate support is rotated at a speed between 20 rpm and 500 rpm. In some examples, the distance g between the lower housing portion including the plurality of spaced holes (or the annular slit) and the substrate is in a range between 0.5 mm and 50 mm. In other examples, the distance g is in a range between 2 mm and 30 mm. In some examples, a gap between the VUV lamp and the substrate is in a range between 2 mm and 50 mm. In some examples, the VUV lamp creates a light spot on the substrate having a diameter on the order of 10 to 100 mm.

In some examples, the VUV lamp has a broadband UV emission spectrum in the UV C band (wavelength from 118 nm to 400 nm with peak wavelength of 160 nm). In some examples, the linear scan speed of the VUV lamp is in a range from 5 to 100 mm/second. In some examples, an increased dwell time of the VUV lamp may be performed over locations with high charge levels in certain locations depending on prior processes.

In one example, wafer discharge or reduction of embedded wafer charge using the charge reduction system was performed on a 1 kA-thick dielectric thermal oxide substrate ($ThO_x$ on a silicon (Si) substrate). The substrate was pre-charged using spin-clean processing with deionized water (DIW) dispensed onto a rotating substrate. As a result of the exposure, a highly negative charge level (up to −23 V) was observed in a central area of the substrate. A positive charge (up to +5 V) was observed at edges of the substrate. After performing charge reduction, the substrate was completely discharged with its charge level back to +/−0.5 V (which is the same as an incoming substrate, before DIW pre-charging).

The charge reducing system according to the present disclosure reduces both surface and embedded wafer charge. The charge reducing system according to the present disclosure counteracts negative charge at central area of the substrate as well as positive charge at edges of the substrate. The charge reducing system according to the present disclosure is capable of reducing high levels of substrate charging during very short exposure times. In some examples, the exposure period is 5 to 15 seconds per substrate. In other examples, the exposure period is 8 to 12 seconds. For example, the exposure period can be 10 seconds. The charge reducing system according to the present disclosure is time-effective and wafer throughput-neutral.

The charge reducing system according to the present disclosure can be integrated with single-wafer spin-clean systems (e.g. one or more chambers dedicated for wafer discharge). Alternately, the charge reducing system according to the present disclosure can be implemented as a stand-alone discharge tool or station depending upon customer needs.

In some examples, the VUV lamp has a wide emission spectrum that includes the presence of 185 nm wavelength. This specific wavelength efficiently decomposes oxygen molecules and synthesizes ozone ($O_3$). To protect the substrate and minimize impact of $O_3$ during discharge, the purge gas may be supplied between the VUV lamp and the substrate. In some examples, the purge gas includes molecular nitrogen ($N_2$) or other suitable purge gas. A low-oxygen environment created between the VUV lamp and the substrate helps to decrease $O_3$ generation due to less oxygen being available. The purge gas allows more VUV radiation to reach the substrate due to the fact that less light is lost due to $O_2$-absorption in a mixed $N_2$/air atmosphere. In surface (non-rotational) tests, the $N_2$ purge can lower $O_2$ content from 21 mass-% (standard air) to less than 5 mass-% (low-$O_2$ conditions). In some examples, a Hamamatsu VUV ionizer (L12542) with deuterium lamp is used with 20 mm source-to-wafer distance. The absence of oxygen avoids absorption of the VUV and thus enhances performance of the charge removing device.

In some examples, reduction of static and embedded wafer charge using the charge reduction system is performed at a pressure that is greater than or equal to 800 hectopascals (hPa). In other examples, reduction of static and embedded wafer charge using the charge reduction system is performed at ambient pressure (1013 hPa+/−10%.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for reducing surface and embedded charge in a substrate, comprising:
   a substrate support configured to support a substrate;
   a vacuum ultraviolet (VUV) assembly, of a processing chamber, that is arranged adjacent to the substrate support and that includes a housing and a VUV lamp that is connected to the housing and that generates and directs ultraviolet (UV) light at the substrate,
   wherein the housing includes:
      a first inlet to receive an oxygen-reducing purge gas;
      a first fluid channel in fluid communication with the first inlet,
         wherein the first fluid channel has an annular shape; and
      a first outlet in fluid communication with the first fluid channel; and
   a movement device configured to move the VUV assembly during exposure of the substrate to the UV light to reduce surface and embedded charge in the substrate,
   wherein the first outlet directs the oxygen-reducing purge gas into a gap between the VUV lamp and the substrate, and
   wherein the first outlet comprises one of:
      a plurality of spaced nozzles passing from the first fluid channel through a substrate-facing surface of the housing; and
      an annular slot passing from the first fluid channel through the substrate-facing surface of the housing.

2. The system for reducing surface and embedded charge of claim 1, further comprising:
   a gas delivery system for supplying the oxygen-reducing purge gas, wherein the oxygen-reducing purge gas has an oxygen content that is less than 5% by mass.

3. The system for reducing surface and embedded charge of claim 1, wherein the housing includes:
   a second inlet to receive ambient gas;
   a second fluid channel in fluid communication with the second inlet; and
   a second outlet in fluid communication with the second fluid channel and a vacuum source.

4. The system for reducing surface and embedded charge of claim 1, wherein the housing is configured to draw ambient gas through the housing under vacuum supplied by a vacuum source remote from the VUV assembly to cool the VUV assembly.

5. The system for reducing surface and embedded charge of claim 1, wherein the movement device includes a rotating device configured to rotate the substrate support relative to the VUV assembly during exposure of the substrate to the UV light generated by the VUV lamp.

6. The system for reducing surface and embedded charge of claim 1, wherein the movement device is configured to move the VUV assembly relative to the substrate support while the UV light is generated by the VUV lamp.

7. The system for reducing surface and embedded charge of claim 1, wherein the movement device includes:
   a substrate rotating device configured to rotate the substrate support during exposure of the substrate to the UV light generated by the VUV lamp; and
   a radial movement device configured to move the VUV assembly in a radial direction relative to the substrate support while the substrate support is rotating and while the UV light is generated by the VUV lamp.

8. The system for reducing surface and embedded charge of claim 1, wherein the VUV lamp has an exposure period that is between 5 seconds and 15 seconds.

9. The system for reducing surface and embedded charge of claim 1, wherein the first fluid channel circumscribes the VUV lamp.

10. The system for reducing surface and embedded charge of claim 1, further comprising:
    a VUV array including a plurality of the VUV assembly, wherein the movement device includes a scanning device configured to scan the VUV array across a surface of the substrate.

11. A treatment system for exposing a substrate to liquid, comprising:
    the system for reducing surface and embedded charge of claim 1; and
    at least one liquid dispenser to dispense liquid on the substrate.

12. The treatment system of claim 11, further comprising one of a spin chuck and a pin chuck including the substrate support.

13. The system for reducing surface and embedded charge of claim 1, wherein the VUV lamp and the substrate support are located in the processing chamber, wherein the processing chamber is one of a closed processing chamber and an open processing chamber that is open to a clean room environment, and wherein ambient gas in the processing chamber has a pressure greater than or equal to 800 hPa.

14. A method for reducing surface and embedded charge in a substrate, comprising:
    arranging a substrate on a substrate support;
    arranging a vacuum ultraviolet (VUV) assembly, of a processing chamber, including a housing and a VUV lamp adjacent to the substrate,
    wherein the housing of the VUV assembly includes:
       a first inlet to receive an oxygen-reducing purge gas;
       a first fluid channel in fluid communication with the first inlet,
          wherein the first fluid channel has an annular shape; and
       a first outlet in fluid communication with the first fluid channel;
    directing, by the first outlet, the oxygen-reducing purge gas into a gap between the VUV lamp and the substrate,
    wherein the first outlet comprises one of:
       a plurality of spaced nozzles passing from the first fluid channel through a substrate-facing surface of the housing; and
       an annular slot passing from the first fluid channel through the substrate-facing surface of the housing; and
    directing ultraviolet (UV) light at the substrate while moving the VUV assembly during exposure of the substrate to the UV light to reduce surface and embedded charge in the substrate.

15. The method of claim 14, further comprising discharging the VUV lamp during an exposure period that is between 5 seconds and 15 seconds.

16. The method of claim 14, further comprising:
    arranging the substrate support and the VUV assembly in the processing chamber, wherein the processing chamber is one of a closed processing chamber and an open processing chamber that is open to a clean room environment; and
    supplying gas having an oxygen content that is less than 5 mass-% to the processing chamber.

17. The method of claim 14, further comprising drawing ambient gas through the housing under vacuum supplied by a vacuum source that is remote from the VUV assembly to cool the VUV assembly.

18. The method of claim 14, wherein the moving includes rotating the substrate support during exposure of the substrate to the UV light generated by the VUV lamp while moving the VUV assembly in a radial direction relative to the substrate support.

19. The method of claim 14, further comprising:
arranging the VUV assembly in a VUV array including a plurality of the VUV assembly; and
scanning the VUV array across a surface of the substrate arranged on the substrate support.

* * * * *